(12) United States Patent
Koshimizu

(10) Patent No.: US 12,706,282 B2
(45) Date of Patent: Aug. 11, 2026

(54) SUBSTRATE SUPPORT AND SUBSTRATE PROCESSING APPARATUS

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 700 days.

(21) Appl. No.: 17/015,100

(22) Filed: Sep. 9, 2020

(65) Prior Publication Data

US 2021/0074524 A1 Mar. 11, 2021

(30) Foreign Application Priority Data

Sep. 9, 2019 (JP) ................................ 2019-163796
Jul. 9, 2020 (JP) ................................ 2020-118606

(51) Int. Cl.
*H01J 37/32* (2006.01)
*H10P 72/72* (2026.01)

(52) U.S. Cl.
CPC .. *H01J 37/32697* (2013.01); *H01J 37/32642* (2013.01); *H01J 37/32724* (2013.01); *H10P 72/722* (2026.01)

(58) Field of Classification Search
None
See application file for complete search history.

(56) References Cited

U.S. PATENT DOCUMENTS 5,581,874 A * 12/1996 Aoki ................ H01L 21/67069 29/458
2005/0230049 A1* 10/2005 Nishio ............. H01J 37/32642 216/61
2009/0242127 A1* 10/2009 Koshimizu ....... H01J 37/32697 156/345.47
2010/0203736 A1* 8/2010 Ichino .............. H01J 37/32183 257/E21.218
2010/0326957 A1* 12/2010 Maeda ................... H01J 37/20 156/345.26
2011/0031217 A1* 2/2011 Himori ............ H01J 37/32165 156/345.48
2014/0209245 A1* 7/2014 Yamamoto ........ H01L 21/67109 361/234
2014/0231389 A1* 8/2014 Nagami ........... H01J 37/32706 156/345.28
2016/0189994 A1* 6/2016 Sasaki ................ H01L 21/6833 361/234
2018/0226225 A1* 8/2018 Koh ................. H01L 21/67069
2020/0058469 A1* 2/2020 Ranjan ................ H01J 37/3211
2020/0135527 A1* 4/2020 Sung ................ H01L 21/67213

FOREIGN PATENT DOCUMENTS

JP 2002-033376 A 1/2002
JP 2004-511901 A 4/2004
JP 2004193564 A 7/2004
JP 2005528790 A 9/2005

(Continued)

*Primary Examiner* — Ram N Kackar
(74) *Attorney, Agent, or Firm* — XSENSUS LLP

(57) ABSTRACT

A structure efficiently provides bias power to an object placed on a substrate support. A substrate support includes a dielectric portion and at least one electrode. The at least one electrode is located in the dielectric portion to provide bias power to an object placed on the dielectric portion.

17 Claims, 12 Drawing Sheets

(56) References Cited

FOREIGN PATENT DOCUMENTS

| | | | |
|---|---|---|---|
| JP | 2011009351 | A | 1/2011 |
| JP | 2011-035266 | A | 2/2011 |
| JP | 2011119654 | A | 6/2011 |
| JP | 4913313 | B2 | 4/2012 |
| JP | 2014-072355 | A | 4/2014 |
| JP | 2016-122740 | A | 7/2016 |
| JP | 2016127170 | A | 7/2016 |
| JP | 2018-110216 | A | 7/2018 |
| JP | 2019036658 | A | 3/2019 |
| JP | 2021515392 | A | 6/2021 |
| KR | 10-20110014104 | A | 2/2011 |
| KR | 10-20140098707 | A | 8/2014 |
| KR | 10-2017-0118011 | A | 10/2017 |
| WO | 2002/31219 | A1 | 4/2002 |
| WO | 2003103004 | A2 | 12/2003 |
| WO | 2019065710 | A1 | 4/2019 |
| WO | 2019164761 | A1 | 8/2019 |

* cited by examiner

SUBSTRATE SUPPORT AND SUBSTRATE PROCESSING APPARATUS

CROSS-REFERENCE TO RELATED APPLICATIONS

This application claims priority to Japanese Patent Application Nos. 2019-163796 filed on Sep. 9, 2019 and 2020-118606 filed on Jul. 9, 2020, the entire disclosure of each is incorporated herein by reference.

TECHNICAL FIELD

Exemplary embodiments of the present disclosure relate to a substrate support and a plasma processing apparatus.

BACKGROUND

A plasma processing apparatus is used to process a substrate. The plasma processing apparatus includes a chamber and a substrate support. The substrate support includes a base and an electrostatic chuck (ESC). The substrate is accommodated in the chamber. The ESC is located on the base. The ESC receives and holds the substrate. To draw ions in plasma generated in the chamber toward the substrate, bias power is provided from a radio-frequency (RF) power supply to the base.

An edge ring is placed onto the substrate support. The substrate is placed in an area on the ESC surrounded by the edge ring. The substrate support may hold the edge ring under an electrostatic attraction. The substrate support to hold the edge ring under an electrostatic attraction is described in Japanese Unexamined Patent Application Publication Nos. 2002-33376 and 2016-122740 and Japanese Unexamined Patent Application Publication (Translation of PCT Application) No. 2004-511901.

SUMMARY

The present disclosure is directed to a technique for efficiently providing bias power to an object placed on the substrate support.

A substrate support according to an exemplary embodiment includes a dielectric portion and at least one electrode. The at least one electrode is located in the dielectric portion to provide bias power to an object placed on the dielectric portion.

The structure according to an exemplary embodiment efficiently provides bias power to an object placed on the substrate support.

DETAILED DESCRIPTION

Figure 1:
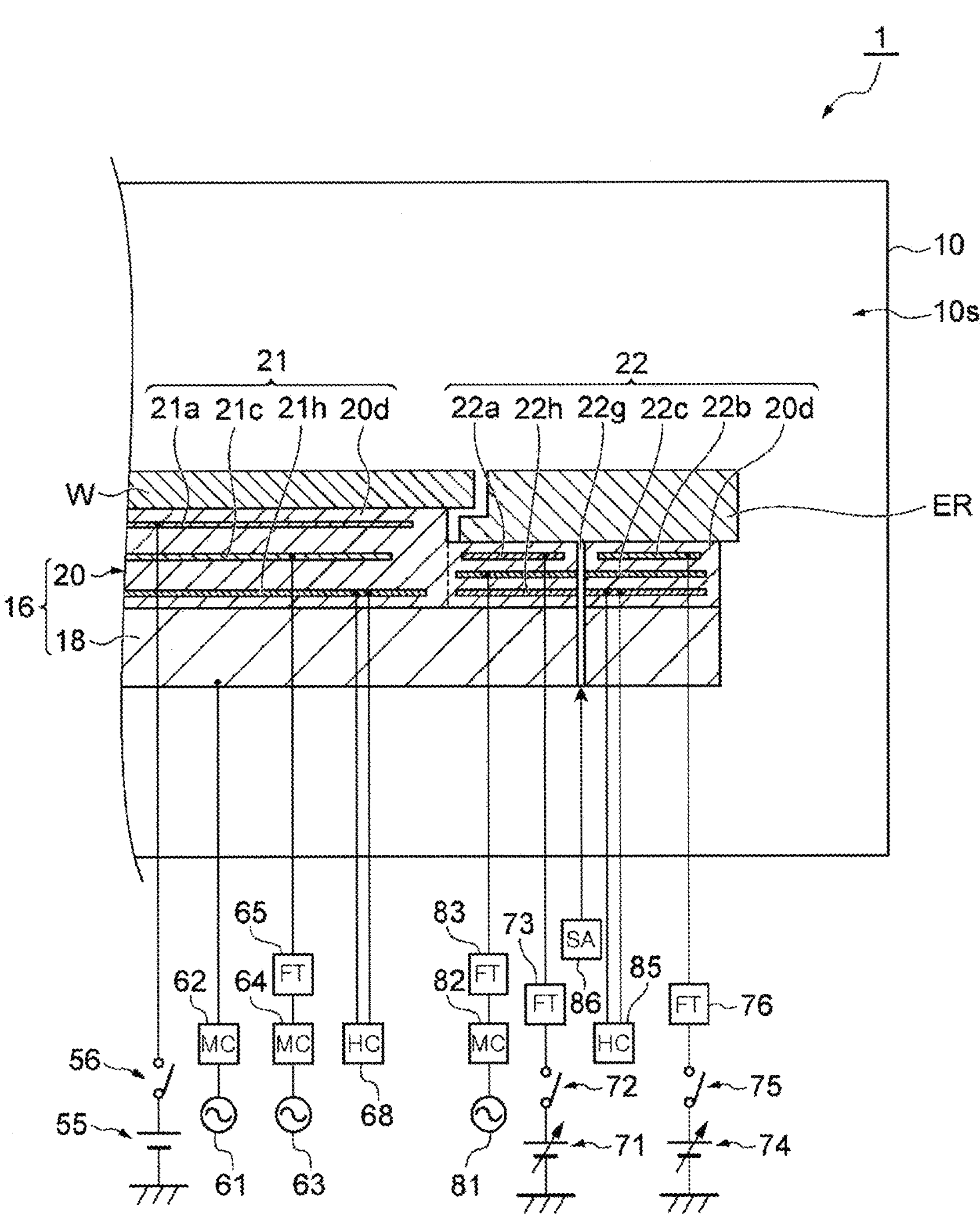
FIG. 1 is a schematic diagram of a plasma processing apparatus according to an exemplary embodiment.

Exemplary embodiments will now be described.

A substrate support according to one exemplary embodiment includes a dielectric portion and at least one electrode. The at least one electrode is located in the dielectric portion to provide bias power to an object placed on the dielectric portion. In the substrate support according to the embodiment, the electrode for receiving bias power is located in the dielectric portion on which the object is placed. The bias power can thus be efficiently provided to the object placed on the substrate support.

In one exemplary embodiment, the substrate support may include a first electrostatic chuck portion and a second electrostatic chuck portion. The first electrostatic chuck portion holds a substrate placed on the first electrostatic chuck portion. The second electrostatic chuck portion surrounds the first electrostatic chuck portion and holds an edge ring placed on the second electrostatic chuck portion. The second electrostatic chuck portion includes one or more electrodes located in the second electrostatic chuck portion. The one or more electrodes generate an electrostatic attraction between the second electrostatic chuck portion and the edge ring and provide bias power to the edge ring through the second electrostatic chuck portion. In this embodiment, the one or more electrodes include the at least one electrode.

In the above embodiment, the one or more electrodes may include a common electrode that receives a voltage for generating the electrostatic attraction between the second electrostatic chuck portion and the edge ring and receives the bias power, or may include an electrode that receives a voltage for generating the electrostatic attraction between the second electrostatic chuck portion and the edge ring, and an electrode that receives the bias power. With the one or more electrodes located in the second electrostatic chuck portion, the bias power can be provided, through the second electrostatic chuck portion, to the edge ring being held on the second electrostatic chuck portion. The substrate support can thus provide bias power to the edge ring in an independent and stable manner.

In the above embodiment, the at least one electrode may be a common electrode that receives a voltage for generating the electrostatic attraction and receives the bias power. In this embodiment, the bias power is provided to the electrode that receives a voltage for generating an electrostatic attraction. This structure can eliminate the electrode dedicated to receiving the bias power located in the second electrostatic chuck portion and can simplify the second electrostatic chuck portion. The substrate support can be fabricated easily at low cost.

In one exemplary embodiment, the one or more electrodes may include a first electrode that receives a voltage for generating the electrostatic attraction, and a second electrode that receives the bias power. In this embodiment, the second electrode corresponds to the at least one electrode.

In one exemplary embodiment, the second electrostatic chuck portion may include a bipolar electrostatic chuck. More specifically, the one or more electrodes may include a pair of electrodes to be a bipolar electrode. In another exemplary embodiment, the second electrostatic chuck portion may include a monopolar electrostatic chuck.

In one exemplary embodiment, the second electrostatic chuck portion may further include at least a part of the dielectric portion. The one or more electrodes are located in at least the part of the dielectric portion.

In one exemplary embodiment, the first electrostatic chuck portion and the second electrostatic chuck portion may commonly include the dielectric portion. The first electrostatic chuck portion may include a chuck electrode. The chuck electrode is an electrode to receive a voltage for attracting the substrate to the first electrostatic chuck portion. The chuck electrode is located in the dielectric portion.

In one exemplary embodiment, the first electrostatic chuck portion may include a first dielectric portion and a chuck electrode. The chuck electrode is an electrode to receive a voltage for attracting the substrate to the first electrostatic chuck portion. The chuck electrode is located in the first dielectric portion. The dielectric portion included in the second electrostatic chuck portion is a second dielectric portion that may be separate from the first dielectric portion.

In one exemplary embodiment, the substrate support may further include a heater located in the dielectric portion included in the second electrostatic chuck portion.

In one exemplary embodiment, the substrate support may further include a gas line that provides a heat-transfer gas to between the second electrostatic chuck portion and the edge ring.

In one exemplary embodiment, the first electrostatic chuck portion may further include an electrode that receives bias power and is located in the first electrostatic chuck portion. In this embodiment, the bias power provided to the substrate through the first electrostatic chuck portion can be controlled independently of the bias power provided to the edge ring through the second electrostatic chuck portion.

In one exemplary embodiment, the substrate support may further include a base. The base is electrically conductive. The base may receive bias power. The first electrostatic chuck portion and the second electrostatic chuck portion may be located on the base.

Plasma processing apparatuses according to other exemplary embodiments are provided.

A plasma processing apparatus according to one exemplary embodiment includes a chamber and a substrate support. The substrate support is the substrate support according to any one of the exemplary embodiments described above. The substrate support is accommodated in the chamber.

In one exemplary embodiment, the plasma processing apparatus includes the substrate support including the first electrostatic chuck portion and the second electrostatic chuck portion according to any one of the exemplary embodiments described above. The plasma processing apparatus further includes a direct-current power supply and a first bias power supply. The direct-current power supply generates a voltage for generating an electrostatic attraction between the second electrostatic chuck portion and the edge ring. The first bias power supply generates bias power to be provided to the edge ring through the second electrostatic chuck portion.

In the plasma processing apparatus according to one exemplary embodiment, the substrate support includes the electrode located in the first electrostatic chuck portion. In this embodiment, the plasma processing apparatus may further include a second bias power supply that generates bias power to be provided to the electrode located in the first electrostatic chuck portion.

In the plasma processing apparatus according to one exemplary embodiment, the substrate support includes the base. In this embodiment, the plasma processing apparatus may further include a second bias power supply that generates bias power to be provided to the base.

In one exemplary embodiment, a plasma processing apparatus includes a chamber, a substrate support, a direct-current power supply, a bias power supply, a common electric path, a first electric path, a second electric path, and an impedance circuit. The substrate support includes the electrode located in the first electrostatic chuck portion. The substrate support is accommodated in the chamber. The direct-current power supply generates a voltage for generating an electrostatic attraction between the second electrostatic chuck portion and the edge ring. The bias power supply generates bias power. The common electric path is coupled to the bias power supply. The first electric path and the second electric path branch from the common electric path. The first electric path provides the bias power to the electrode located in the first electrostatic chuck portion. The second electric path provides the bias power to the edge ring through the second electrostatic chuck portion. The impedance circuit is located on at least one of the first electric path or the second electric path. In this embodiment, the bias power provided to the edge ring through the second electrostatic chuck portion and the bias power provided to the electrode located in the first electrostatic chuck portion are generated from the bias power generated by the bias power supply and distributed through the first electric path and the second electric path.

In one exemplary embodiment, a plasma processing apparatus includes a chamber, a substrate support, a direct-current power supply, a bias power supply, a common electric path, a first electric path, a second electric path, and an impedance circuit. The substrate support includes the base. The substrate support is accommodated in the chamber. The direct-current power supply generates a voltage for generating an electrostatic attraction between the second electrostatic chuck portion and the edge ring. The bias power supply generates bias power. The common electric path is coupled to the bias power supply. The first electric path and the second electric path branch from the common electric path. The first electric path provides the bias power to the base. The second electric path provides the bias power to the edge ring through the second electrostatic chuck portion. The impedance circuit is located on at least one of the first electric path or the second electric path. In this embodiment, the bias power provided to the edge ring through the second electrostatic chuck portion and the bias power provided to the base are generated from the bias power generated by the bias power supply and distributed through the first electric path and the second electric path.

Exemplary embodiments will now be described in detail with reference to the drawings. In the drawings, similar or corresponding components are indicated by like reference numerals. The embodiments are illustrated by way of example and not by way of limitation in the accompanying drawings that are not to scale unless otherwise indicated.

Figure 2:
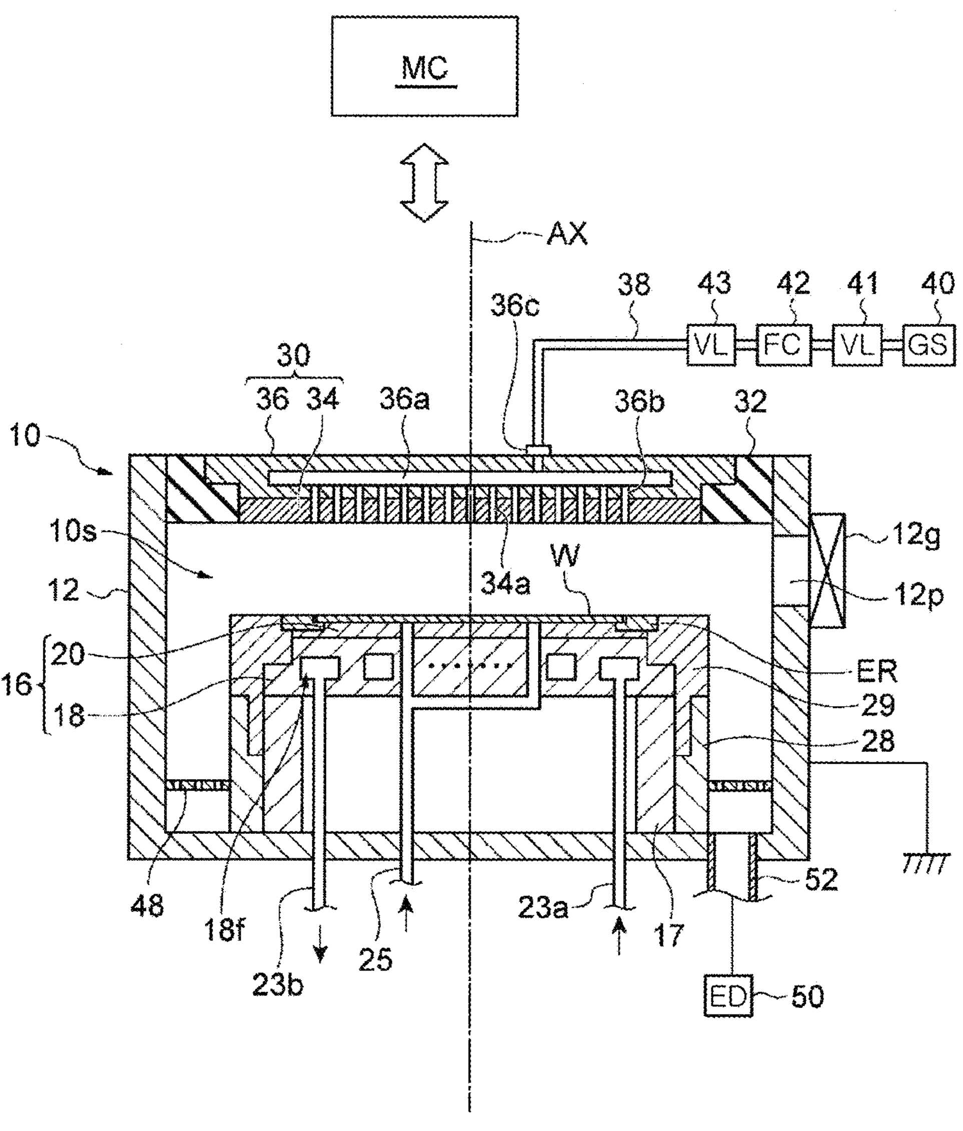
FIG. 2 is a diagram of the plasma processing apparatus according to the exemplary embodiment showing the internal structure of a chamber in detail.

FIG. 1 is a schematic diagram of a plasma processing apparatus according to an exemplary embodiment. A plasma processing apparatus 1 shown in FIG. 1 includes a chamber 10. FIG. 2 is a diagram of the plasma processing apparatus according to the exemplary embodiment showing its internal structure in detail. As shown in FIG. 2, the plasma processing apparatus 1 may be a capacitively coupled plasma processing apparatus.

The chamber 10 has an internal space 10*s*. The central axis in the internal space 10*s* is an axis AX extending in the vertical direction. In one embodiment, the chamber 10 includes a chamber body 12, which is substantially cylindrical and has the internal space 10*s*. The chamber body 12 is formed from, for example, aluminum. The chamber body 12 is electrically grounded. The chamber body 12 has an inner wall defining the internal space 10*s*, coated with a plasma-resistant film. The plasma-resistant film may be a ceramic film, such as an anodized film or a film formed from yttrium oxide.

The chamber body 12 has a side wall having a port 12*p*. A substrate W is transferred between the internal space 10*s* and the outside of the chamber 10 through the port 12*p*. A gate valve 12*g* is on the side wall of the chamber body 12 to open and close the port 12*p*.

The plasma processing apparatus 1 further includes a substrate support 16 according to an exemplary embodiment. The substrate support 16 supports the substrate W placed on the substrate support 16 in the chamber 10. The substrate W is substantially disk-shaped. The substrate support 16 is supported by a support 17. The support 17 extends upward from the bottom of the chamber body 12. The support 17 is substantially cylindrical and is formed from an insulating material such as quartz.

The substrate support 16 includes a base 18 and an electrostatic chuck (ESC) 20. The base 18 and the ESC 20 are accommodated in the chamber 10. The base 18 is formed from a conductive material such as aluminum and is substantially disk-shaped.

The base 18 has an internal channel 18*f* for carrying a heat-exchange medium, such as a liquid refrigerant. The channel 18*f* is connected to a supply unit (e.g., a chiller unit) for supplying the heat-exchange medium. The supply unit is located external to the chamber 10. The supply unit supplies the heat-exchange medium to the channel 18*f* through a pipe 23*a*. The heat-exchange medium supplied to the channel 18*f* returns to the supply unit through a pipe 23*b*.

The ESC 20 is located on the base 18. The substrate W is placed onto and held by the ESC 20 for being processed in the internal space 10*s*. An edge ring ER is placed onto the substrate support 16. The edge ring ER is a substantially annular plate. The edge ring ER is electrically conductive. The edge ring ER is formed from, for example, silicon or silicon carbide. The edge ring ER is placed onto the substrate support 16 with its central axis aligned with the axis AX. The substrate W accommodated in the chamber 10 is placed in an area on the ESC 20 surrounded by the edge ring ER.

The plasma processing apparatus 1 may further include a gas supply line 25. The gas supply line 25 supplies a heat-transfer gas (e.g., He gas) from a gas supply assembly to a space between the upper surface of the ESC 20 (first ESC portion described later) and a back surface (lower surface) of the substrate W.

The plasma processing apparatus 1 may further include an outer peripheral portion 28 and an outer peripheral portion 29. The outer peripheral portion 28 extends upward from the bottom of the chamber body 12. The outer peripheral portion 28 is substantially cylindrical and extends along the outer periphery of the support 17. The outer peripheral portion 28 is substantially cylindrical and formed from a conductive material. The outer peripheral portion 28 is electrically grounded. The outer peripheral portion 28 has a surface coated with a plasma-resistant film, which may be a ceramic film, such as an anodized film or a film formed from yttrium oxide.

The outer peripheral portion 29 is located on the outer peripheral portion 28. The outer peripheral portion 29 is formed from an insulating material. The outer peripheral portion 29 is substantially cylindrical and is formed from, for example, ceramic such as quartz. The outer peripheral portion 29 extends along the outer peripheries of the base 18 and the ESC 20.

The plasma processing apparatus 1 further includes an upper electrode 30 that is located above the substrate support 16. The upper electrode 30 closes a top opening of the chamber body 12 together with an insulating member 32. The upper electrode 30 is supported on an upper portion of the chamber body 12 with the member 32.

The upper electrode 30 includes a ceiling plate 34 and a support member 36. The ceiling plate 34 has its lower surface defining the internal space 10*s*. The ceiling plate 34 has multiple gas outlet holes 34*a* that are through-holes in the thickness direction (vertical direction). The ceiling plate 34 is formed from, but is not limited to, silicon. In some embodiments, the ceiling plate 34 may be an aluminum member coated with a plasma-resistant film. The plasma-resistant film may be a ceramic film, such as an anodized film or a film formed from yttrium oxide.

The support member 36 supports the ceiling plate 34 in a detachable manner. The support member 36 is formed from a conductive material such as aluminum. The support member 36 has an internal gas-diffusion compartment 36*a*. Multiple gas holes 36*b* extend downward from the gas-diffusion compartment 36*a*. The gas holes 36*b* communicate with the respective gas outlet holes 34*a*. The support member 36 has a gas inlet 36*c*. The gas inlet 36*c* connects to the gas-diffusion compartment 36*a*. The gas inlet 36*c* also connects to a gas supply pipe 38.

The gas supply pipe 38 is connected to a set of gas sources (GS) 40 via a set of valves (VL) 41, a set of flow controllers (FC) 42, and a set of valves (VL) 43. The gas source set 40, the valve set 41, the flow controller set 42, and the valve set 43 form a gas supply unit. The gas source set 40 includes multiple gas sources. The valve sets 41 and 43 each include multiple valves (e.g., open-close valves). The flow controller set 42 includes multiple flow controllers. The flow controllers in the flow controller set 42 are mass flow controllers or pressure-based flow controllers. The gas sources in the gas source set 40 are connected to the gas supply pipe 38 via the respective valves in the valve set 41, via the respective flow controllers in the flow controller set 42, and via the respective valves in the valve set 43. The plasma processing apparatus 1 can supply gas from one or more gas sources selected from the multiple gas sources in the gas source set 40 to the internal space 10*s* at an individually controlled flow rate.

A baffle plate 48 is located between the outer peripheral portion 28 and the side wall of the chamber body 12. The baffle plate 48 may include, for example, an aluminum member covered with ceramic such as yttrium oxide. The baffle plate 48 has many through-holes. An exhaust pipe 52 is connected to the bottom of the chamber body 12 below the baffle plate 48. The exhaust pipe 52 is connected to an exhaust device (ED) 50. The exhaust device 50 includes a pressure controller such as an automatic pressure control valve and a vacuum pump such as a turbomolecular pump to reduce the pressure in the internal space 10*s*.

The substrate support 16 will now be described in detail. As described above, the substrate support 16 includes the base 18 and the ESC 20. As shown in FIG. 1, the base 18 is coupled to a radio-frequency (RF) power supply 61 via an impedance matching circuit, or matcher (MC) 62. The RF power supply 61 generates RF power for generating plasma. The RF power supply 61 generates RF power having a frequency ranging from 27 to 100 MHz, or for example, 40 or 60 MHz. The matcher 62 includes a matching circuit for matching the output impedance of the RF power supply 61 and the impedance of a load (the base 18). The RF power supply 61 may not be electrically coupled to the base 18, and may be coupled to the upper electrode 30 via the matcher 62.

In the plasma processing apparatus 1, the gas in the chamber 10 is excited to generate plasma in response to RF power provided from the RF power supply 61. The substrate W is processed with chemical species, such as ions and/or radicals contained in the generated plasma.

The ESC 20 includes a first ESC portion 21 and a second ESC portion 22. The first ESC portion 21 and the second ESC portion 22 are located on the base 18. In the substrate support 16 in the plasma processing apparatus 1, the first ESC portion 21 and the second ESC portion 22 are continuous and integral with each other. In FIG. 1, a broken line indicates the interface between the first ESC portion 21 and the second ESC portion 22.

The first ESC portion 21 holds the substrate W placed on the first ESC portion 21 (placed on the upper surface of the first ESC portion 21). The first ESC portion 21 is disk-shaped. The first ESC portion 21 has its central axis substantially aligned with the axis AX. The first ESC portion 21 and the second ESC portion 22 commonly include a dielectric portion 20*d*. The dielectric portion 20*d* is formed from a dielectric such as aluminum nitride or aluminum oxide. The dielectric portion 20*d* is substantially disk-shaped. In one embodiment, the dielectric portion 20*d* included in the second ESC portion 22 has a smaller thickness than the dielectric portion 20*d* included in the first ESC portion 21. The dielectric portion 20*d* included in the second ESC portion 22 may have its upper surface lower than the upper surface of the dielectric portion 20*d* included in the first ESC portion 21 in the vertical direction.

The first ESC portion 21 includes an electrode 21*a* (chuck electrode). The electrode 21*a* is an internal film electrode located in the dielectric portion 20*d* included in the first ESC portion 21. The electrode 21*a* is coupled to a direct-current (DC) power supply 55 via a switch 56. A DC voltage applied from the DC power supply 55 to the electrode 21*a* generates an electrostatic attraction between the first ESC portion 21 and the substrate W. The first ESC portion 21 attracts the substrate W under the generated electrostatic attraction and holds the substrate W.

The first ESC portion 21 may further include an electrode 21*c*. The electrode 21*c* is an internal film electrode located in the dielectric portion 20*d* included in the first ESC portion 21. The electrode 21*a* may extend nearer the upper surface of the first ESC portion 21 than the electrode 21*c* in the vertical direction. The electrode 21*c* is coupled to a bias power supply 63 via an impedance matching circuit, or matcher (MC) 64 and a filter (FT) 65. The bias power supply 63 may be electrically coupled to the base 18 via the matcher 64 and the filter 65. In this case, the electrode 21*c* in the first ESC portion 21 may be eliminated.

The bias power supply 63 generates bias power for drawing ions in plasma generated in the chamber 10 toward the substrate W. The bias power supply 63 may generate bias power having periodicity. In one embodiment, the bias power supply 63 generates RF power to be the bias power. In this case, the bias power supply 63 generates bias power having a lower frequency than the RF power generated by the RF power supply 61. The bias power supply 63 generates bias power having a frequency ranging from 400 kHz to 13.56 MHz, or for example, 400 kHz.

The matcher 64 is coupled between the bias power supply 63 and the electrode 21*c*. The matcher 64 matches the output impedance of the bias power supply 63 and the impedance of a load (the electrode 21*c*). The filter 65 is coupled between the matcher 64 and the electrode 21*c*. The filter 65 is an electric filter that cuts or reduces RF power generated by the RF power supply 61. The filter 65 prevents RF power generated by the RF power supply 61 from entering the bias power supply 63 or reduces RF power entering the bias power supply 63.

In another embodiment, the bias power supply 63 may generate pulsed RF power that is periodically generated to be the bias power. More specifically, the bias power supply 63 may switch between providing RF power and stopping providing RF power to the electrode 21*c*. In still another embodiment, the bias power supply 63 may periodically apply a pulsed negative DC voltage to the electrode 21*c* to be the bias power. In this case, the bias power supply 63 may periodically generate a pulsed negative DC voltage in accordance with, for example, the frequency of 400 kHz. The level of the pulsed negative DC voltage may vary while the pulsed negative DC voltage is being applied to the electrode 21*c*.

The first ESC portion 21 may further include a heater 21*h*. The heater 21*h* is located in the dielectric portion 20*d* included in the first ESC portion 21. The electrodes 21*a* and 21*c* may extend nearer the upper surface of the first ESC portion 21 than the heater 21*h* in the vertical direction. The heater 21*h* may include a resistance heating element. The heater 21*h* is connected to a heater controller (HC) 68. The heater controller 68 provides power to the heater 21*h*. The heater controller 68 controls the level of the power provided to the heater 21*h*. The first ESC portion 21 may include multiple heaters.

The first ESC portion 21 may further include a part of the gas supply line 25. As described above, the gas supply line 25 supplies a heat-transfer gas (e.g., He gas) to a space between the first ESC portion 21 and the back surface of the substrate W. The gas supply line 25 is connected to the gas supply assembly, which is a heat-transfer gas source.

The second ESC portion 22 surrounds the first ESC portion 21. The second ESC portion 22 is substantially annular. The second ESC portion 22 has its central axis substantially aligned with the axis AX. The second ESC portion 22 holds the edge ring ER placed on the second ESC portion 22 (placed on the upper surface of the second ESC portion 22). The second ESC portion 22 and the first ESC portion 21 commonly include the dielectric portion 20*d*.

The second ESC portion 22 includes one or more electrodes. The one or more electrodes are located in the second ESC portion 22 to generate an electrostatic attraction between the edge ring ER and the second ESC portion 22 and to provide bias power to the edge ring ER through the second ESC portion 22. The one or more electrodes are located in the dielectric portion 20*d* included in the second ESC portion 22.

In one embodiment, the second ESC portion 22 includes a first electrode and a second electrode. The first electrode receives a voltage for generating an electrostatic attraction. The second electrode receives bias power.

In one embodiment, the second ESC portion 22 forms a bipolar ESC. In other words, the second ESC portion 22 includes a pair of electrodes forming a bipolar electrode. In the substrate support 16 in the plasma processing apparatus 1, the second ESC portion 22 specifically includes an electrode 22*a* and an electrode 22*b* as the first electrode forming the bipolar electrode including a pair of electrodes. The electrodes 22*a* and 22*b* are film electrodes. The electrodes 22*a* and 22*b* may extend substantially at the same level in the vertical direction.

The electrode 22*a* is electrically coupled to a DC power supply 71 via a switch 72 and a filter (FT) 73. The filter 73 is an electric filter that cuts or reduces RF power and bias power. The filter 73 prevents RF power and bias power from entering the DC power supply 71 or reduces RF power and bias power entering the DC power supply 71.

The electrode 22*b* is electrically coupled to a DC power supply 74 via a switch 75 and a filter (FT) 76. The filter 76 is an electric filter that cuts or reduces RF power and bias power. The filter 76 prevents RF power and bias power from entering the DC power supply 74 or reduces RF power and bias power entering the DC power supply 74.

The DC power supplies 71 and 74 respectively apply DC voltages to the electrodes 22*a* and 22*b* to cause a potential difference between the electrodes 22*a* and 22*b*. The electrodes 22*a* and 22*b* may be set to a positive potential, a negative potential, or 0 V. For example, the electrode 22*a* may be set to a positive potential and the electrode 22*b* may be set to a negative potential. A single DC power supply, rather than two DC power supplies, may be used to cause a potential difference between the electrodes 22*a* and 22*b*.

A potential difference between the electrodes 22*a* and 22*b* generates an electrostatic attraction between the second ESC portion 22 and the edge ring ER. The second ESC portion 22 attracts the edge ring ER under the generated electrostatic attraction and holds the edge ring ER.

The second ESC portion 22 further includes an electrode 22*c* as the second electrode. The electrode 22*c* is a film electrode located in the dielectric portion 20*d* included in the second ESC portion 22. The electrodes 22*a* and 22*b* may extend nearer the upper surface of the second ESC portion 22 than the electrode 22*c* in the vertical direction. The electrode 22*c* is coupled to a bias power supply 81 via an impedance matching circuit, or matcher (MC) 82 and a filter (FT) 83.

The bias power supply 81 generates bias power. The bias power supply 81 may generate RF power (or bias power) having the same frequency as the RF power (or bias power) generated by the bias power supply 63. In some embodiments, the bias power supply 81 may periodically generate a pulsed negative DC voltage to be the bias power in the same manner as the bias power supply 63. The matcher 82 matches the output impedance of the bias power supply 81 and the impedance of a load (the electrode 22*c*). The filter 83 is coupled between the matcher 82 and the electrode 22*c*. The filter 83 is an electric filter that cuts or reduces RF power generated by the RF power supply 61. The filter 83 prevents RF power generated by the RF power supply 61 from entering the bias power supply 81 or reduces RF power entering the bias power supply 81.

The second ESC portion 22 may further include a heater 22*h*. The heater 22*h* is located in the dielectric portion 20*d* included in the second ESC portion 22. The electrodes 22*a*, 22*b*, and 22*c* may extend nearer the upper surface of the second ESC portion 22 than the heater 22*h* in the vertical direction. The heater 22*h* may be a resistance heating element. The heater 22*h* is connected to a heater controller (HC) 85. The heater controller 85 provides power to the heater 22*h*. The heater controller 85 controls the level of the power provided to the heater 22*h*. The second ESC portion 22 may include multiple heaters. The heaters 21*h* and 22*h* may receive power from the same single heater controller.

The second ESC portion 22 may further include a gas line 22*g*. The gas line 22*g* supplies a heat-transfer gas (e.g., He gas) to between the second ESC portion 22 and the edge ring ER. The gas line 22*g* is connected to a gas supply assembly (SA) 86, which is a heat-transfer gas source.

In one embodiment, the plasma processing apparatus 1 may further include a controller MC as shown in FIG. 2. The controller MC is a computer including a processor, a storage, an input device, and a display, and controls the components of the plasma processing apparatus 1. More specifically, the controller MC executes a control program stored in the storage to control the components of the plasma processing apparatus 1 in accordance with recipe data stored in the storage. In response to the control by the controller MC, a process specified by the recipe data is performed in the plasma processing apparatus 1.

In the substrate support 16 in the plasma processing apparatus 1, the second ESC portion 22 includes the electrodes 22*a*, 22*b*, and 22*c*. The bias power can thus be provided, through the second ESC portion 22, to the edge ring ER being held on the second ESC portion 22. The substrate support 16 in the plasma processing apparatus 1 can thus provide bias power to the edge ring ER in an independent and stable manner.

In the substrate support 16 in the plasma processing apparatus 1, the first ESC portion 21 includes the electrode 21*c* and the second ESC portion 22 includes the electrode 22*c*. The electrodes 21*c* and 22*c* each separately receive bias power. The bias power provided to the substrate W through the first ESC portion 21 can thus be controlled independently of the bias power provided to the edge ring ER through the second ESC portion 22.

Figure 3:
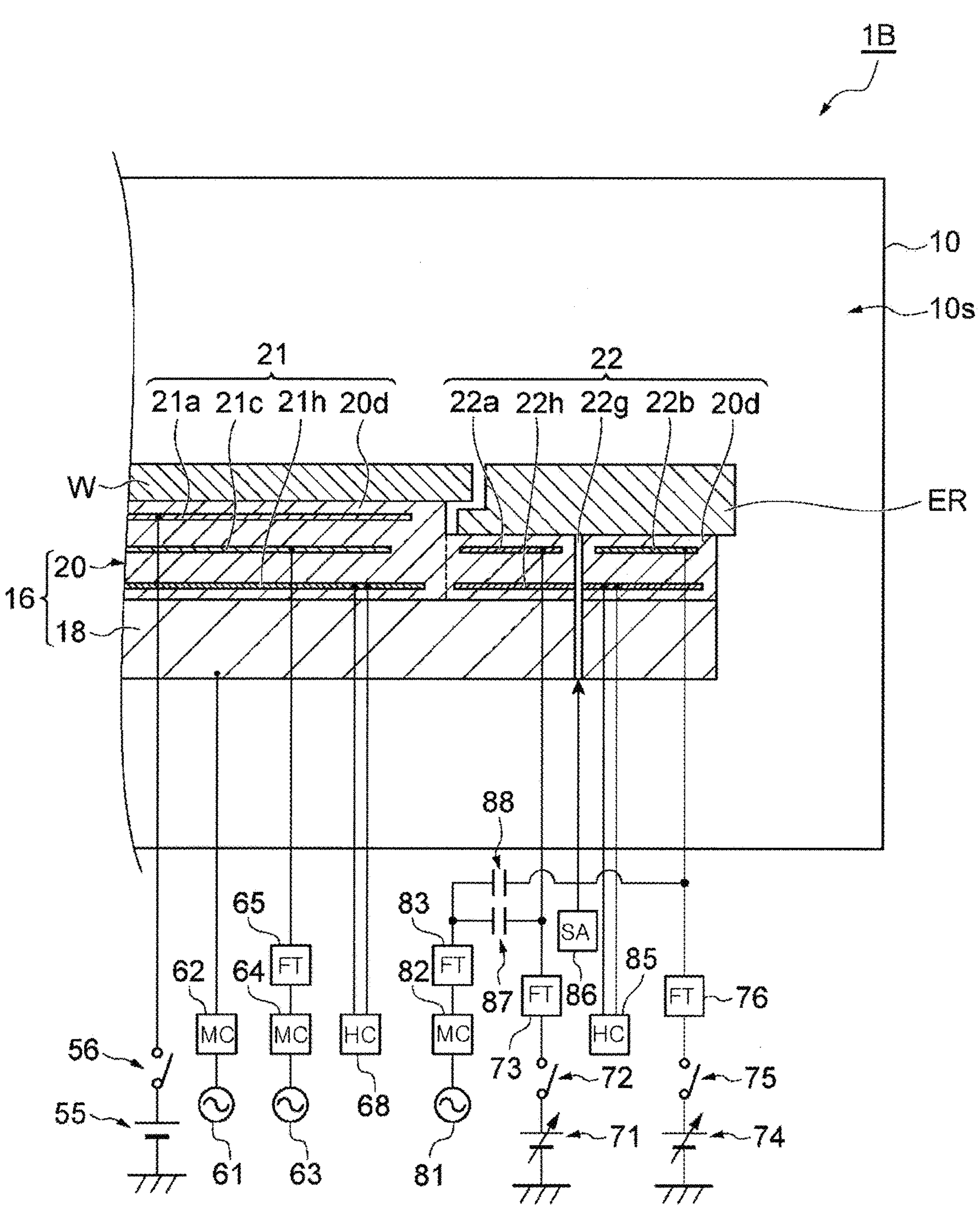
FIG. 3 is a schematic diagram of a plasma processing apparatus according to another exemplary embodiment.

FIG. 3 is a schematic diagram of a plasma processing apparatus according to another exemplary embodiment. A plasma processing apparatus 1B shown in FIG. 3 will now be described focusing on its differences from the plasma processing apparatus 1.

The plasma processing apparatus 1B includes common electrodes to receive a voltage for generating an electrostatic attraction between the second ESC portion 22 and the edge ring ER and to receive bias power. More specifically, in the plasma processing apparatus 1B, the bias power supply 81 is coupled to both the electrodes 22*a* and 22*b* through the matcher 82 and the filter 83. In the plasma processing apparatus 1B, bias power from the bias power supply 81 is distributed to the electrodes 22*a* and 22*b*.

The bias power supply 81 may be coupled to the electrode 22*a* via a blocking capacitor 87. The bias power supply 81 may also be coupled to the electrode 22*b* via a blocking capacitor 88. The blocking capacitors 87 and 88 prevent a DC current from entering the bias power supply 81 or reduce a DC current entering the bias power supply 81.

In the substrate support 16 in the plasma processing apparatus 1B, bias power is provided to the electrodes 22*a* and 22*b* that receive a voltage for generating an electrostatic attraction. This structure can eliminate the electrode 22*c* dedicated to receiving bias power located in the second ESC portion 22 and can simplify the second ESC portion 22. The substrate support 16 in the plasma processing apparatus 1B can be fabricated easily at low cost.

The substrate support 16 in the plasma processing apparatus 1B may have a shorter distance between the edge ring ER and each of the electrodes 22*a* and 22*b* for receiving bias power. The substrate support 16 thus has a larger capacitance between the edge ring ER and each of the electrodes 22*a* and 22*b*. This structure increases bias power provided to the electrodes 22*a* and 22*b* to be coupled to the edge ring ER. In contrast, this structure reduces bias power provided to the electrodes 22*a* and 22*b* to be provided to the substrate W. The bias power provided to the edge ring ER can thus be controlled independently in a more reliable manner.

Figure 4:
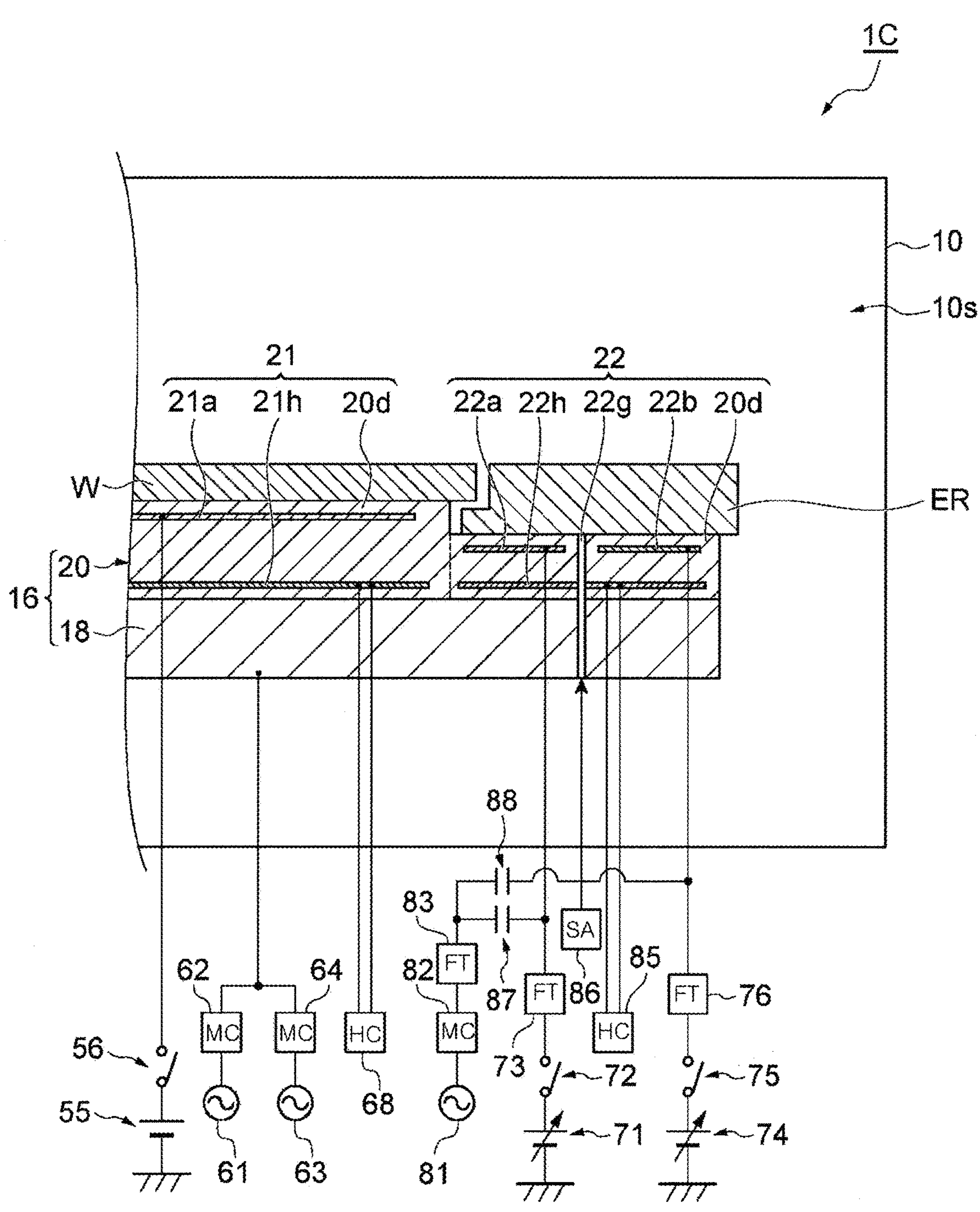
FIG. 4 is a schematic diagram of a plasma processing apparatus according to still another exemplary embodiment.

FIG. 4 is a schematic diagram of a plasma processing apparatus according to still another exemplary embodiment. A plasma processing apparatus 1C shown in FIG. 4 will now be described focusing on its differences from the plasma processing apparatus 1B.

In the plasma processing apparatus 1C, the bias power supply 63 is coupled to the base 18 via the matcher 64. In the plasma processing apparatus 1C, the bias power supply 63 and the bias power supply 81 provide bias power to the edge ring ER through the second ESC portion 22. The bias power supply 81 can provide less bias power.

Figure 5:
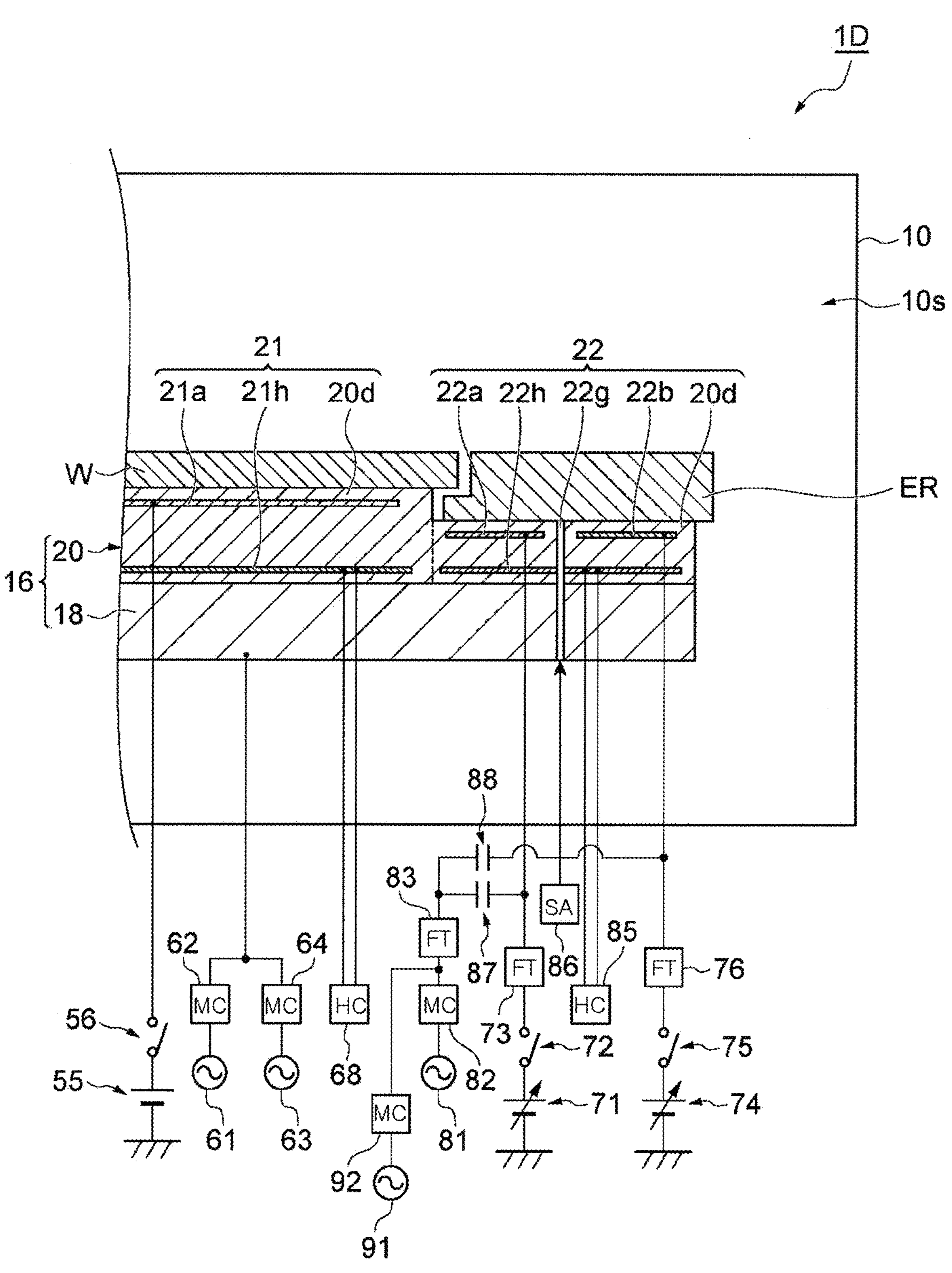
FIG. 5 is a schematic diagram of a plasma processing apparatus according to still another exemplary embodiment.

FIG. 5 is a schematic diagram of a plasma processing apparatus according to still another embodiment. A plasma processing apparatus 1D shown in FIG. 5 will now be described focusing on its differences from the plasma processing apparatus 1C.

The plasma processing apparatus 1D further includes an RF power supply 91. The RF power supply 91 is coupled to the electrode 22*a* via an impedance matching circuit, or matcher (MC) 92, the filter 83, and the blocking capacitor 87. The RF power supply 91 is coupled to the electrode 22*b* via the matcher 92, the filter 83, and the blocking capacitor 88. The RF power supply 91 generates RF power having the same frequency as the RF power generated by the RF power supply 61. In the plasma processing apparatus 1D, the RF power from the RF power supply 91 is coupled to plasma through the second ESC portion 22 and the edge ring ER. This structure allows control of the density of plasma in an area above the edge ring independently of the density of plasma in an area above the substrate W.

In the plasma processing apparatus 1D, the electrode 22*c* included in the second ESC portion 22 may be coupled to the RF power supply 91 and the bias power supply 81.

Figure 6:
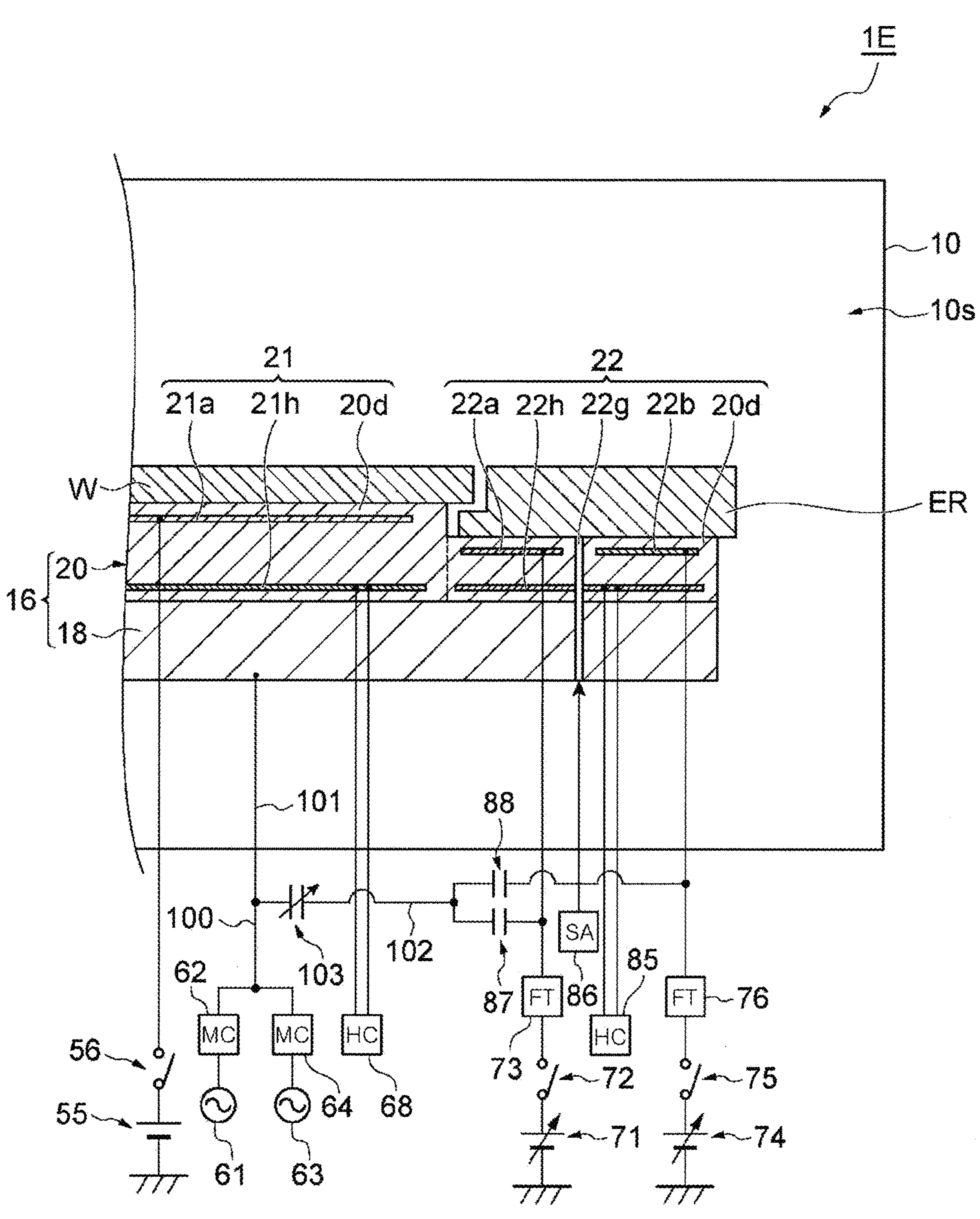
FIG. 6 is a schematic diagram of a plasma processing apparatus according to still another exemplary embodiment.

FIG. 6 is a schematic diagram of a plasma processing apparatus according to still another exemplary embodiment. A plasma processing apparatus 1E shown in FIG. 6 will now be described focusing on its differences from the plasma processing apparatus 1C.

The plasma processing apparatus 1E includes a common electric path 100, a first electric path 101, and a second electric path 102. The common electric path 100 is coupled to the RF power supply 61 and the bias power supply 63. The first electric path 101 and the second electric path 102 branch from the common electric path 100. The first electric path 101 is coupled to the base 18. The second electric path 102 is coupled to the electrode 22*a* via the blocking capacitor 87. The second electric path 102 is also coupled to the electrode 22*b* via the blocking capacitor 88. In the plasma processing apparatus 1E, RF power from the RF power supply 61 and bias power from the bias power supply 63 are distributed to the base 18 and the electrodes 22*a* and 22*b*. The plasma processing apparatus 1E thus eliminates the bias power supply 81, the matcher 82, and the filter 83.

An impedance circuit 103 is located on the second electric path 102. The impedance circuit 103 may include a variable impedance element. The variable impedance element may be a variable capacitor. The ratio of the bias power provided from the bias power supply 63 to the electrodes 22*a* and 22*b* to the bias power provided from the bias power supply 63 to the base 18 can be adjusted by controlling the impedance of the impedance circuit 103. The ratio of the RF power provided from the RF power supply 61 to the electrodes 22*a* and 22*b* to the RF power provided from the RF power supply 61 to the base 18 can also be adjusted by controlling the impedance of the impedance circuit 103. The plasma processing apparatus 1E may include fewer bias power supplies than the plasma processing apparatus 1C. The plasma processing apparatus 1E can be relatively inexpensive.

An impedance circuit similar to the impedance circuit 103 may be located on the first electric path 101. When an impedance circuit is located on the first electric path 101, the impedance circuit 103 may or may not be located on the second electric path 102.

In the plasma processing apparatus 1E, the electrode 22*c* included in the second ESC portion 22 may be coupled to the RF power supply 61 and the bias power supply 63 through the second electric path 102.

Figure 7:
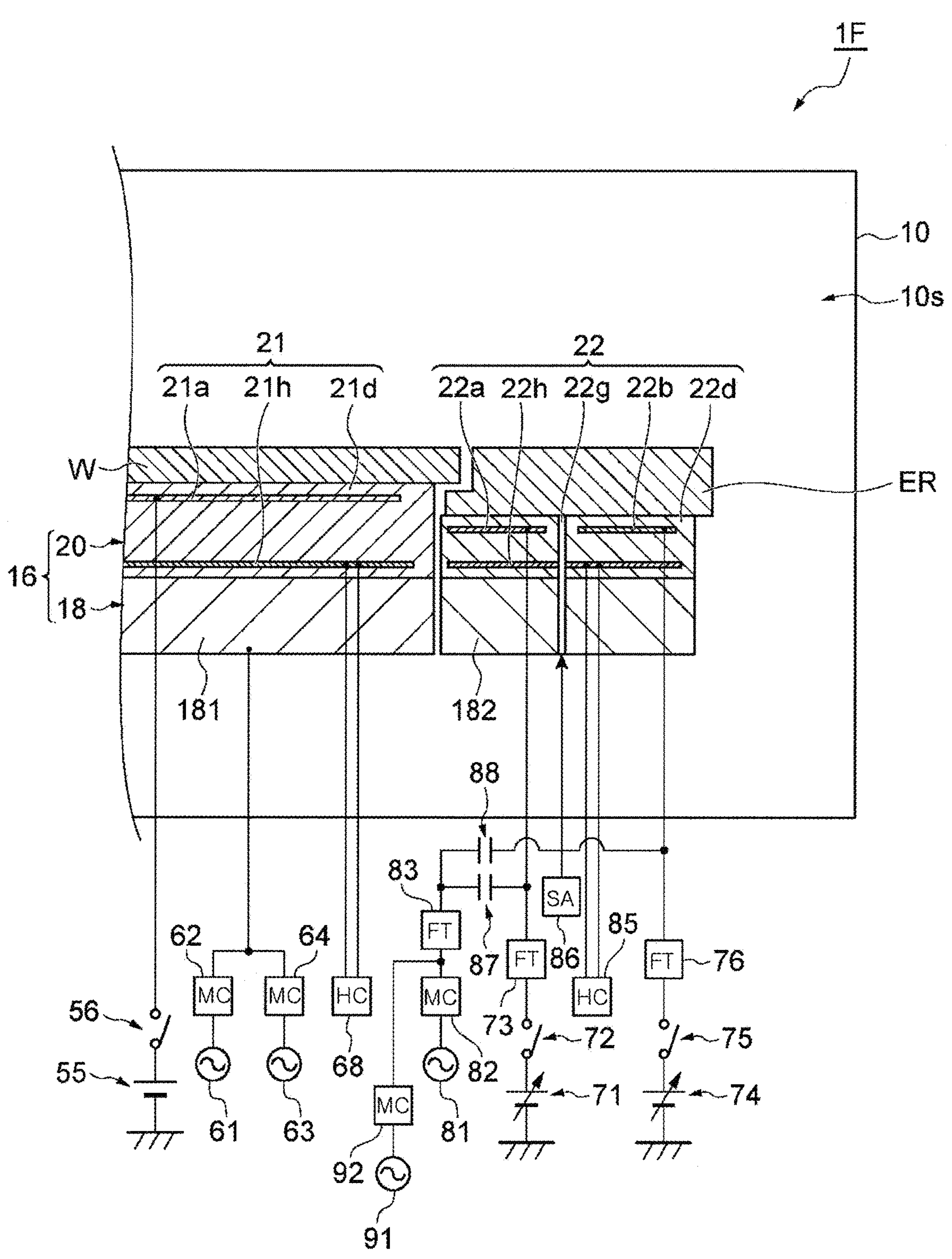
FIG. 7 is a schematic diagram of a plasma processing apparatus according to still another exemplary embodiment.

FIG. 7 is a schematic diagram of a plasma processing apparatus according to still another exemplary embodiment. A plasma processing apparatus 1F shown in FIG. 7 will now be described focusing on its differences from the plasma processing apparatus 1D.

In the substrate support 16 in the plasma processing apparatus 1F, the first ESC portion 21 includes a first dielectric portion 21*d* and the second ESC portion 22 includes a second dielectric portion 22*d*. The first dielectric portion 21*d* and the second dielectric portion 22*d* are each formed from a dielectric such as aluminum nitride or aluminum oxide.

The first dielectric portion 21*d* is substantially disk-shaped. The first dielectric portion 21*d* has its central axis substantially aligned with the axis AX. The first dielectric portion 21*d* includes the electrode 21*a* and the heater 21*h*.

The second dielectric portion 22*d* extends to surround the first dielectric portion 21*d*. The second dielectric portion 22*d* is a substantially annular plate. The second dielectric portion 22*d* has its central axis substantially aligned with the axis AX. The second dielectric portion 22*d* includes the electrodes 22*a* and 22*b* and the heater 22*h*. In one embodiment, the second dielectric portion 22*d* has a smaller thickness than the first dielectric portion 21*d*. The second dielectric portion 22*d* may have its upper surface lower than the upper surface of the first dielectric portion 21*d* in the vertical direction.

In the substrate support 16 in the plasma processing apparatus 1F, the first dielectric portion 21*d* and the second dielectric portion 22*d* are separate from each other. In other words, the first dielectric portion 21*d* is spaced from the second dielectric portion 22*d*.

In the substrate support 16 in the plasma processing apparatus 1F, the base 18 includes a first portion 181 and a second portion 182, which are spaced from each other. The first portion 181 is electrically coupled to the RF power supply 61 and the bias power supply 63. The first portion 181 supports the first ESC portion 21 placed on the first portion 181. The second portion 182 supports the second ESC portion 22 placed on the second portion 182.

In the substrate support 16 in the plasma processing apparatus 1F, the electrode 21*c* located in the first dielectric portion 21*d* may be coupled to the RF power supply 61 and the bias power supply 63.

Figure 8:
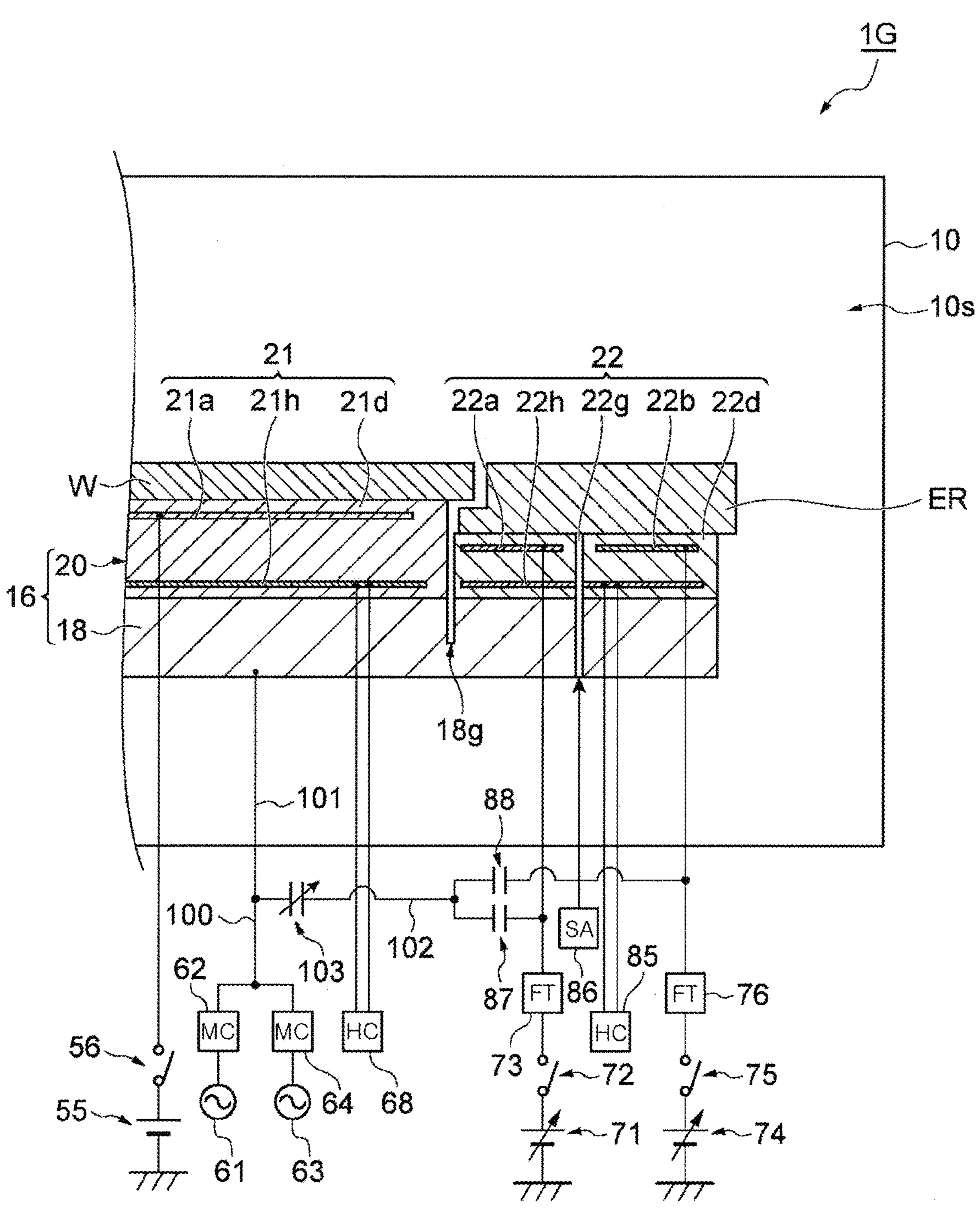
FIG. 8 is a schematic diagram of a plasma processing apparatus according to still another exemplary embodiment.

FIG. 8 is a schematic diagram of a plasma processing apparatus according to still another exemplary embodiment.

A plasma processing apparatus 1G shown in FIG. 8 will now be described focusing on its differences from the plasma processing apparatus 1F.

In the substrate support 16 in the plasma processing apparatus 1G, the first ESC portion 21 includes the first dielectric portion 21*d* and the second ESC portion 22 includes the second dielectric portion 22*d* as in the substrate support 16 in the plasma processing apparatus 1F. In the substrate support 16 in the plasma processing apparatus 1G, the base 18 does not include two separate portions (the first portion 181 and the second portion 182), unlike the base 18 in the substrate support 16 in the plasma processing apparatus 1F. In the substrate support 16 in the plasma processing apparatus 1G, the base 18 may have a groove 18*g*. The groove 18*g* has an opening in the upper surface of the base 18. The bottom of the groove 18*g* is located between the upper opening and the lower surface of the base 18. The groove 18*g* is located between an area of the base 18 on which the first ESC portion 21 extends and an area of the base 18 on which the second ESC portion 22 extends.

Figure 9:
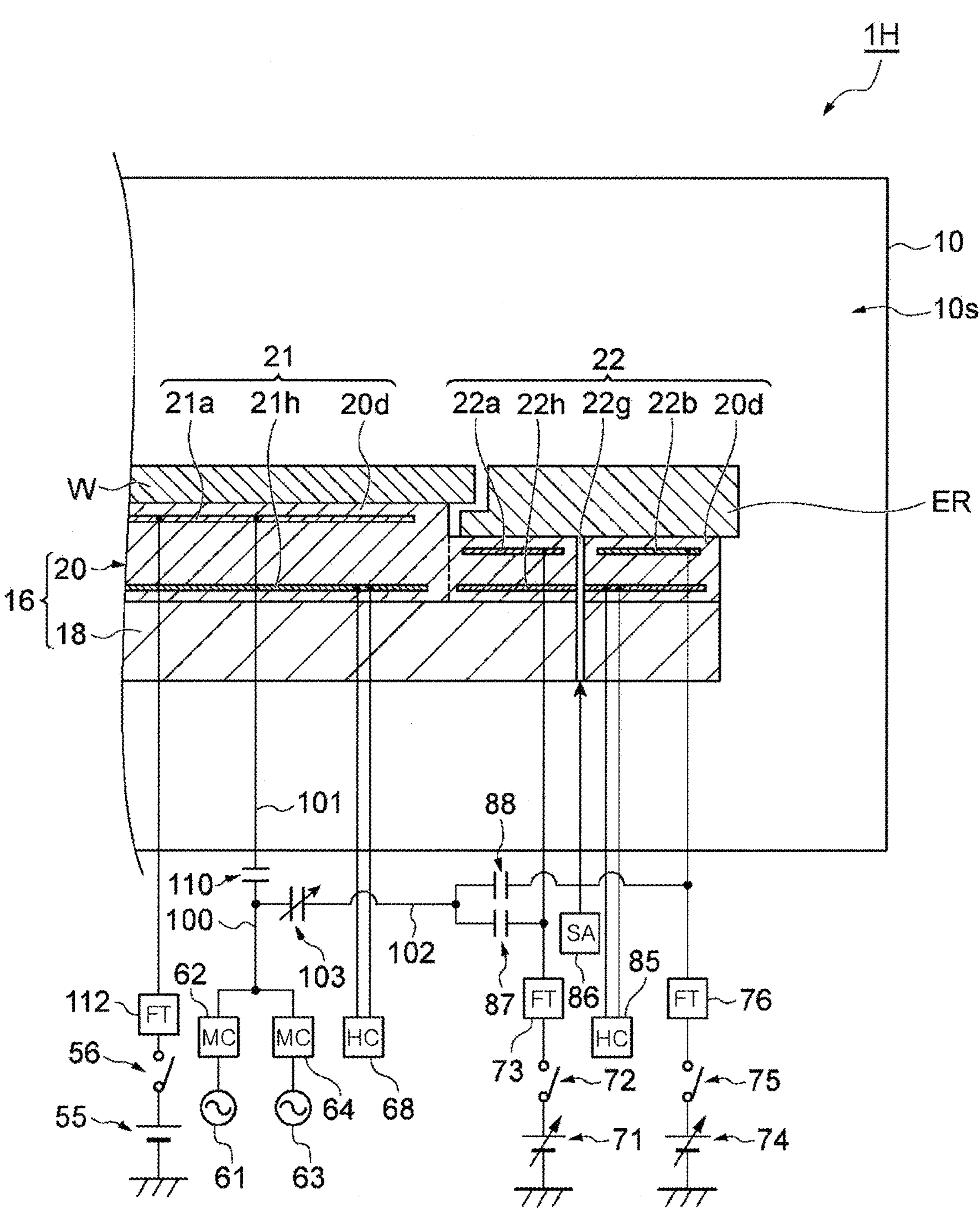
FIG. 9 is a schematic diagram of a plasma processing apparatus according to still another exemplary embodiment.

FIG. 9 is a schematic diagram of a plasma processing apparatus according to still another exemplary embodiment. A plasma processing apparatus 1H shown in FIG. 9 will now be described focusing on its differences from the plasma processing apparatus 1E.

In the plasma processing apparatus 1H, the first electric path 101 is coupled to the electrode 21*a*. The first electric path 101 includes a capacitor 110. The capacitor 110 may be a fixed capacitor or a variable capacitor. The capacitor 110 may prevent a DC current from entering the bias power supply 81 or may reduce a DC current entering the bias power supply 81. The capacitor 110 may adjust the distribution ratio of the RF power and the distribution ratio of the bias power between the electrode 21*a* and each of the electrodes 22*a* and 22*b*.

The plasma processing apparatus 1H may include a filter (FT) 112 coupled between the DC power supply 55 and the electrode 21*a*. The filter 112 is an electric filter that cuts or reduces RF power generated by the RF power supply 61 and bias power generated by the bias power supply 63. The filter 112 prevents RF power and bias power generated by the RF power supply 61 and the bias power supply 63 from entering the DC power supply 55 or reduces RF power and bias power entering the DC power supply 55.

Figure 10:
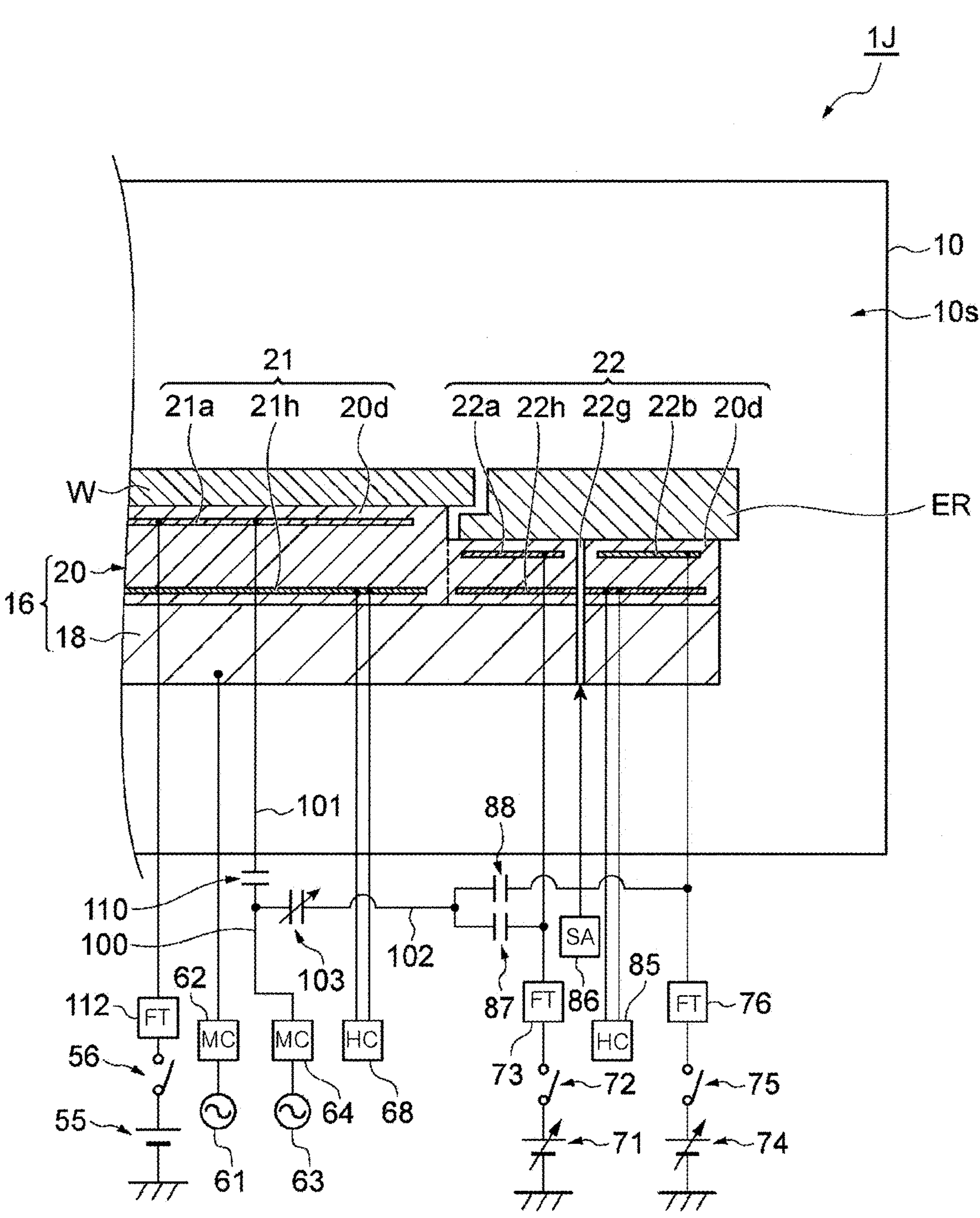
FIG. 10 is a schematic diagram of a plasma processing apparatus according to still another exemplary embodiment.

FIG. 10 is a schematic diagram of a plasma processing apparatus according to still another exemplary embodiment. A plasma processing apparatus 1J shown in FIG. 10 differs from the plasma processing apparatus 1H in that the RF power supply is electrically coupled to the base 18. The other components of the plasma processing apparatus 1J are identical to the corresponding components of the plasma processing apparatus 1H.

Figure 11:
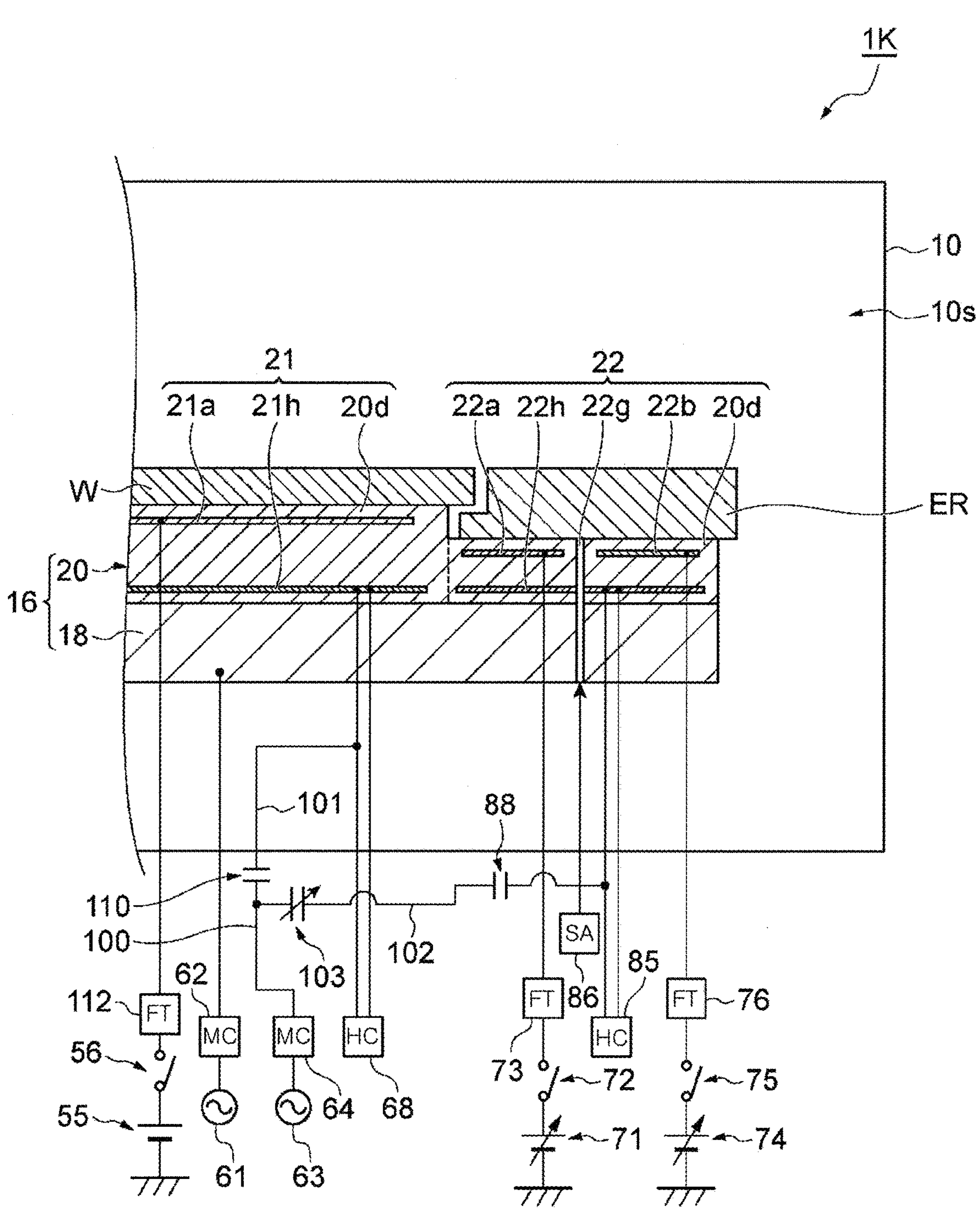
FIG. 11 is a schematic diagram of a plasma processing apparatus according to still another exemplary embodiment.

FIG. 11 is a schematic diagram of a plasma processing apparatus according to still another exemplary embodiment. A plasma processing apparatus 1K shown in FIG. 11 differs from the plasma processing apparatus 1J in that the bias power supply 63 is electrically coupled to heaters 21*h* and 22*h*. The other components of the plasma processing apparatus 1K are identical to the corresponding components of the plasma processing apparatus 1J.

Figure 12A:
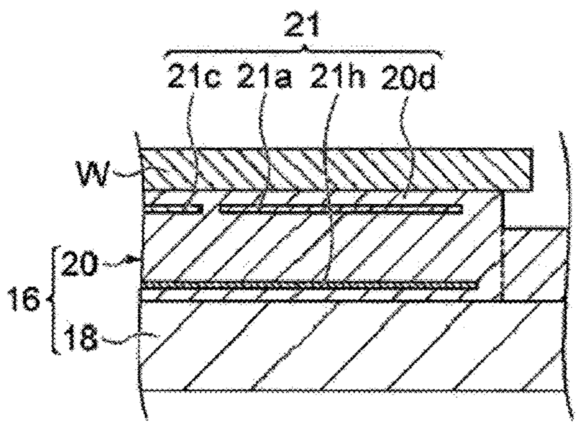
FIG. 12A is a partially enlarged view of another exemplary first electrostatic chuck (ESC) portion.
Figure 12B:
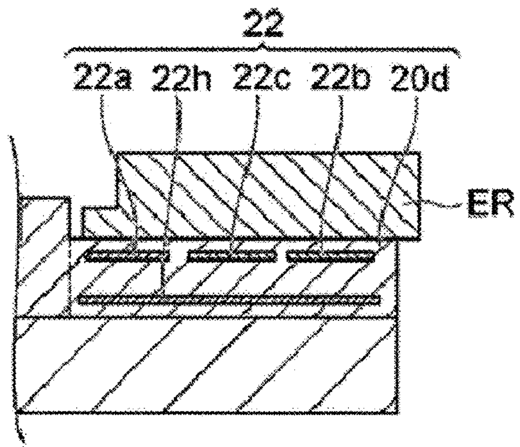
FIGS. 12B and 12C are partially enlarged views of other exemplary second ESC portions.
Figure 12C:
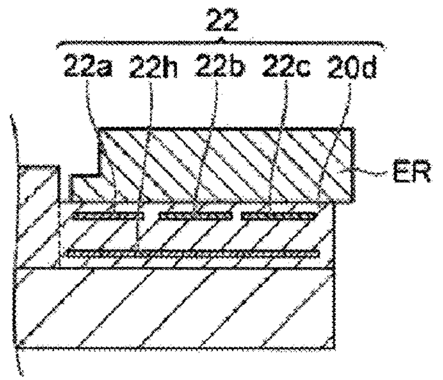

FIG. 12A is a partially enlarged view of another exemplary first ESC portion, and FIGS. 12B and 12C are partially enlarged views of other exemplary second ESC portions. As shown in FIG. 12A, the electrodes 21*a* and 21*c* may extend at the same level in the vertical direction in the first ESC portion 21 in the substrate support 16 according to the embodiments described above. As shown in FIGS. 12B and 12C, the electrodes 22*a* to 22*c* may extend at the same level in the vertical direction in the second ESC portion 22 in the substrate support 16 according to the embodiments described above. As shown in FIG. 12B, the electrode 22*c* may be located between the electrodes 22*a* and 22*b* in the lateral direction. In some embodiments, as shown in FIG. 12C, the electrode 22*b* may be located between the electrodes 22*a* and 22*c* in the lateral direction. In the substrate support 16 including the second ESC portion 22 shown in FIGS. 12B and 12C, the electrode 21*c* in the first ESC portion 21 may extend at the same level as the electrode 22*c* in the vertical direction.

Although the exemplary embodiments have been described above, the embodiments are not restrictive, and various additions, omissions, substitutions, and changes may be made. The components described in the different exemplary embodiments may be combined to form another exemplary embodiment.

For example, the substrate support 16 may include either the first ESC portion 21 or the second ESC portion 22 or both the first and second ESC portions 21 and 22. In other words, the substrate support 16 may include a dielectric portion and at least one electrode. The at least one electrode is located in the dielectric portion to provide bias power to an object placed on the dielectric portion. The object is at least one of the substrate W or the edge ring ER. The at least one electrode may be the electrode located in the dielectric portion included in the first ESC portion 21. In some embodiments, the at least one electrode may be the electrode located in the dielectric portion included in the second ESC portion 22. In some embodiments, the at least one electrode may include both the electrode located in the dielectric portion included in the first ESC portion 21 and the electrode located in the dielectric portion included in the second ESC portion 22. Examples of the electrode located in the dielectric portion included in the first ESC portion 21 include the electrodes 21*a* and 21*c* and the heater 21*h*. Examples of the electrode located in the dielectric portion included in the second ESC portion 22 include the electrodes 22*a* to 22*c* and the heater 22*h*.

The second ESC portion 22 may be a monopolar ESC. More specifically, the second ESC portion 22 may include one or more electrodes that receive a single voltage for generating an electrostatic attraction, in place of a pair of electrodes serving as a bipolar electrode.

The first and second ESC portions 21 and 22 and the base 18 in the plasma processing apparatuses 1E and 1H may have the same structures as the first and second ESC portions 21 and 22 and the base 18 in the plasma processing apparatus 1F.

The first and second ESC portions 21 and 22 and the base 18 in the plasma processing apparatuses 1, 1B to 1E, 1H, 1J, and 1K may have the same structures as the first and second ESC portions 21 and 22 and the base 18 in the plasma processing apparatus 1G.

The plasma processing apparatus including the substrate support 16 according to the embodiments described above may include any type of plasma processing apparatus. Examples of such plasma processing apparatuses include an inductively coupled plasma processing apparatus, an electron cyclotron resonance (ECR) plasma processing apparatus, and a plasma processing apparatus that generates plasma using surface waves such as microwaves.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure is defined by the appended claims.

The invention claimed is:

1. A plasma processing apparatus, comprising:
a chamber;
a substrate support disposed in the chamber, the substrate support including:
a first electrostatic chuck portion configured to hold a substrate placed on the first electrostatic chuck portion; and
a second electrostatic chuck portion surrounding the first electrostatic chuck portion, the second electrostatic chuck portion being configured to hold an edge ring placed on the second electrostatic chuck portion, the second electrostatic chuck portion including;
a first edge chucking electrode,
a second edge chucking electrode separated from the first edge chucking electrode on a same plane, and
an edge bias electrode extending along a length of both the first edge chucking electrode and the second edge chucking electrode, wherein the first edge chucking electrode and the second edge chucking electrode are located above the edge bias electrode which is located in the second electrostatic chuck portion; and
a voltage pulse generator electrically connected to the edge bias electrode and configured to generate a pulsed direct current (DC) voltage.

2. The plasma processing apparatus according to claim 1, wherein the second electrostatic chuck portion includes a bipolar electrostatic chuck.

3. The plasma processing apparatus according to claim 1, wherein
the second electrostatic chuck portion further includes a dielectric portion, and
the first and second edge chucking electrodes and the edge bias electrode are located in the dielectric portion.

4. The plasma processing apparatus according to claim 3, wherein
the first electrostatic chuck portion and the second electrostatic chuck portion commonly include the dielectric portion, and
the first electrostatic chuck portion includes a central chucking electrode located in the dielectric portion.

5. The plasma processing apparatus according to claim 3, wherein
the dielectric portion includes a first dielectric portion and a second dielectric portion,
the first electrostatic chuck portion includes
the first dielectric portion, and
a central chucking electrode located in the first dielectric portion, and
the second electrostatic chuck portion includes the second dielectric portion.

6. The plasma processing apparatus according to claim 5, wherein the second dielectric portion has a smaller thickness than the first dielectric portion.

7. The plasma processing apparatus according to claim 3, further comprising:
a heater located in the dielectric portion included in the second electrostatic chuck portion.

8. The plasma processing apparatus according to claim 1, further comprising:
a gas line configured to provide a heat-transfer gas between the second electrostatic chuck portion and the edge ring.

9. The plasma processing apparatus according to claim 1, further comprising:
a base that is electrically conductive, wherein
the first electrostatic chuck portion and the second electrostatic chuck portion are located on the base.

10. The plasma processing apparatus according to claim 9, wherein
the first electrostatic chuck portion includes a first dielectric portion,
the second electrostatic chuck portion includes a second dielectric portion, and
the first dielectric portion is separated from the second dielectric portion by a groove that extends into the base.

11. The plasma processing apparatus according to claim 10, wherein the second dielectric portion has a smaller thickness than the first dielectric portion.

12. The plasma processing apparatus according to claim 10, wherein the groove has a bottom that is between an upper surface of the base and a lower surface of the base.

13. The plasma processing apparatus according to claim 1, wherein the pulsed DC voltage has a negative polarity.

14. The plasma processing apparatus according to claim 1, further comprising a gas line which separates the first edge chucking electrode from the second edge chucking electrode.

15. The plasma processing apparatus according to claim 1, further comprising a filter which prevents RF power generated by an RF power supply from entering a bias power supply which supplies a bias to an electrode of the first electrode chuck portion.

16. The plasma processing apparatus according to claim 1, further comprising a filter which reduces RF power generated by an RF power supply from entering a bias power supply which supplies a bias to an electrode of the first electrode chuck portion.

17. The plasma processing apparatus according to claim 1, wherein
the first edge chucking electrode has a negative potential,
the second edge chucking electrode has a positive potential, and
the first edge chucking electrode and the second edge chucking electrode form a bipolar electrode.

* * * * *